US012787754B2

(12) United States Patent
Kim et al.

(10) Patent No.: US 12,787,754 B2
(45) Date of Patent: Nov. 3, 2026

(54) SEMICONDUCTOR DEVICE

(71) Applicant: SAMSUNG ELECTRONICS CO., LTD., Suwon-si (KR)

(72) Inventors: Jun Sung Kim, Suwon-si (KR); Kyeong Beom Park, Suwon-si (KR); Su Hyun Bark, Suwon-si (KR); Jong Min Baek, Suwon-si (KR); Jun Hyuk Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 398 days.

(21) Appl. No.: 18/634,162

(22) Filed: Apr. 12, 2024

(65) Prior Publication Data

US 2025/0118670 A1 Apr. 10, 2025

(30) Foreign Application Priority Data

Oct. 4, 2023 (KR) ........................ 10-2023-0131488

(51) Int. Cl.
*H10W 20/41* (2026.01)
*H10W 20/42* (2026.01)

(52) U.S. Cl.
CPC ......... *H10W 20/435* (2026.01); *H10W 20/42* (2026.01)

(58) Field of Classification Search
CPC ............................ H10W 20/435; H10W 20/42
USPC .......................................................... 257/734
See application file for complete search history.

(56) References Cited

U.S. PATENT DOCUMENTS 9,312,222 B2 4/2016 Ting et al.
2016/0111325 A1* 4/2016 JangJian ............. H10W 20/056 257/774
2021/0119116 A1 4/2021 Liou et al.
2021/0257293 A1* 8/2021 Lee ..................... H10W 20/033
2022/0108917 A1 4/2022 Shaviv et al.
2022/0319922 A1 10/2022 Wu et al.
2022/0367376 A1 11/2022 Kuo et al.
2023/0048536 A1 2/2023 Lin
2023/0073308 A1 3/2023 Wu et al.

* cited by examiner

*Primary Examiner* — Igwe U Anya
(74) *Attorney, Agent, or Firm* — Sughrue Mion, PLLC

(57) ABSTRACT

Provided is a semiconductor device and method of manufacturing same, the semiconductor device including: a substrate; an interlayer insulating layer on the substrate; an upper wiring trench in the interlayer insulating layer; an upper wiring layer including an upper wiring barrier layer along a sidewall of the upper wiring trench and a bottom surface of the upper wiring trench, and an upper wiring filling layer on the upper wiring barrier layer, wherein the upper wiring filling layer fills an inside of the upper wiring trench; and a first etching stop layer on each of an upper surface of the interlayer insulating layer and an upper surface of the upper wiring layer, the first etching stop layer including: a first portion in contact with an upper surface of the upper wiring filling layer; a second portion in contact with an upper surface of the upper wiring barrier layer; and a third portion in contact with the upper surface of the interlayer insulating layer, wherein a percentage of nitrogen (N) in the first portion is greater than a percentage of nitrogen (N) in the second portion.

20 Claims, 17 Drawing Sheets

SEMICONDUCTOR DEVICE

CROSS-REFERENCE TO RELATED APPLICATION

This application is based on and claims priority to Korean Patent Application No. 10-2023-0131488, filed on Oct. 4, 2023, in the Korean Intellectual Property Office, and the disclosure of which is incorporated herein in its entirety by reference.

BACKGROUND

1. Field

The present disclosure relates to a semiconductor device.

2. Description of Related Art

As the development of electronics technology has progressed, down-scaling of semiconductor devices has also progressed rapidly, thereby requiring high integration and low power consumption of semiconductor chips. A spacing between circuit components such as wiring patterns is gradually decreasing, and an etching stop layer is used to stably form the wiring patterns. However, in the process of forming the etching stop layer, a void is formed between the wiring pattern and the etching stop layer, thereby reducing reliability of the wiring, and thus reducing a yield of the semiconductor device.

SUMMARY

Provided is a semiconductor device in which a void is prevented from being formed between an upper wiring barrier layer and an etching stop layer, thereby improving reliability of the upper wiring layer.

According to an aspect of the disclosure, a semiconductor device includes: a substrate; an interlayer insulating layer on the substrate; an upper wiring trench in the interlayer insulating layer; an upper wiring layer including an upper wiring barrier layer along a sidewall of the upper wiring trench and a bottom surface of the upper wiring trench, and an upper wiring filling layer on the upper wiring barrier layer, wherein the upper wiring filling layer fills an inside of the upper wiring trench; and a first etching stop layer on each of an upper surface of the interlayer insulating layer and an upper surface of the upper wiring layer, the first etching stop layer including: a first portion in contact with an upper surface of the upper wiring filling layer; a second portion in contact with an upper surface of the upper wiring barrier layer; and a third portion in contact with the upper surface of the interlayer insulating layer, wherein a percentage of nitrogen (N) in the first portion is greater than a percentage of nitrogen (N) in the second portion.

According to an aspect of the disclosure, a semiconductor device includes: a substrate; an interlayer insulating layer on the substrate; a via trench in the interlayer insulating layer; a via including: a via barrier layer along a sidewall of the via trench and a bottom surface of the via trench; and a via filling layer on the via barrier layer, wherein the via filling layer fills an inside of the via trench; an upper wiring trench on the via trench in the interlayer insulating layer; an upper wiring layer connected to the via, the upper wiring layer including: an upper wiring barrier layer along a sidewall of the upper wiring trench and a bottom surface of the upper wiring trench; and an upper wiring filling layer on the upper wiring barrier layer, wherein the upper wiring filling layer fills an inside of the upper wiring trench; and a first etching stop layer on each of an upper surface of the interlayer insulating layer and an upper surface of the upper wiring layer, the first etching stop layer including: a first portion in contact with an upper surface of the upper wiring filling layer; a second portion in contact with an upper surface of the upper wiring barrier layer; and a third portion in contact with the upper surface of the interlayer insulating layer, wherein a width of the via in a horizontal direction is smaller than a width of the upper wiring layer in the horizontal direction, and wherein a percentage of nitrogen (N) in the first portion is greater than a percentage of nitrogen (N) in the third portion.

According to an aspect of the disclosure, a semiconductor device includes: a substrate; a lower interlayer insulating layer on the substrate; a lower wiring layer in the lower interlayer insulating layer; an interlayer insulating layer on an upper surface of the lower interlayer insulating layer and an upper surface of the lower wiring layer; a via trench in the interlayer insulating layer; a via connected to the lower wiring layer, the via including: a via barrier layer along a sidewall of the via trench and a bottom surface of the via trench; and a via filling layer on the via barrier layer, wherein the via filling layer fills an inside of the via trench; an upper wiring trench on the via trench in the interlayer insulating layer; an upper wiring layer connected to the via, the upper wiring layer including: an upper wiring barrier layer along a sidewall of the upper wiring trench and a bottom surface of the upper wiring trench; a first conductive layer on the upper wiring barrier layer, wherein the first conductive layer fills a portion of an inside of the upper wiring trench; and a second conductive layer on an upper surface of the first conductive layer, the second conductive layer including a material different from a material of the first conductive layer; an etching stop layer on each of an upper surface of the interlayer insulating layer and an upper surface of the upper wiring layer, the etching stop layer including: a first portion in contact with an upper surface of the second conductive layer; a second portion in contact with an upper surface of the upper wiring barrier layer; and a third portion in contact with the upper surface of the interlayer insulating layer; and an upper interlayer insulating layer in contact with an upper surface of the etching stop layer on the upper surface of the etching stop layer, wherein a width of the via in a horizontal direction is smaller than a width of the upper wiring layer in the horizontal direction, wherein the upper wiring barrier layer is between an upper surface of the via filling layer and a lower surface of the first conductive layer, wherein a percentage of nitrogen (N) in the first portion is greater than a percentage of nitrogen (N) in the second portion, and wherein the percentage of nitrogen (N) in the second portion is greater than a percentage of nitrogen (N) in the third portion.

The present disclosure is not limited to the above-mentioned embodiments, and other purposes and advantages according to the present disclosure may be understood based on the following description.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTION

Figure 1:
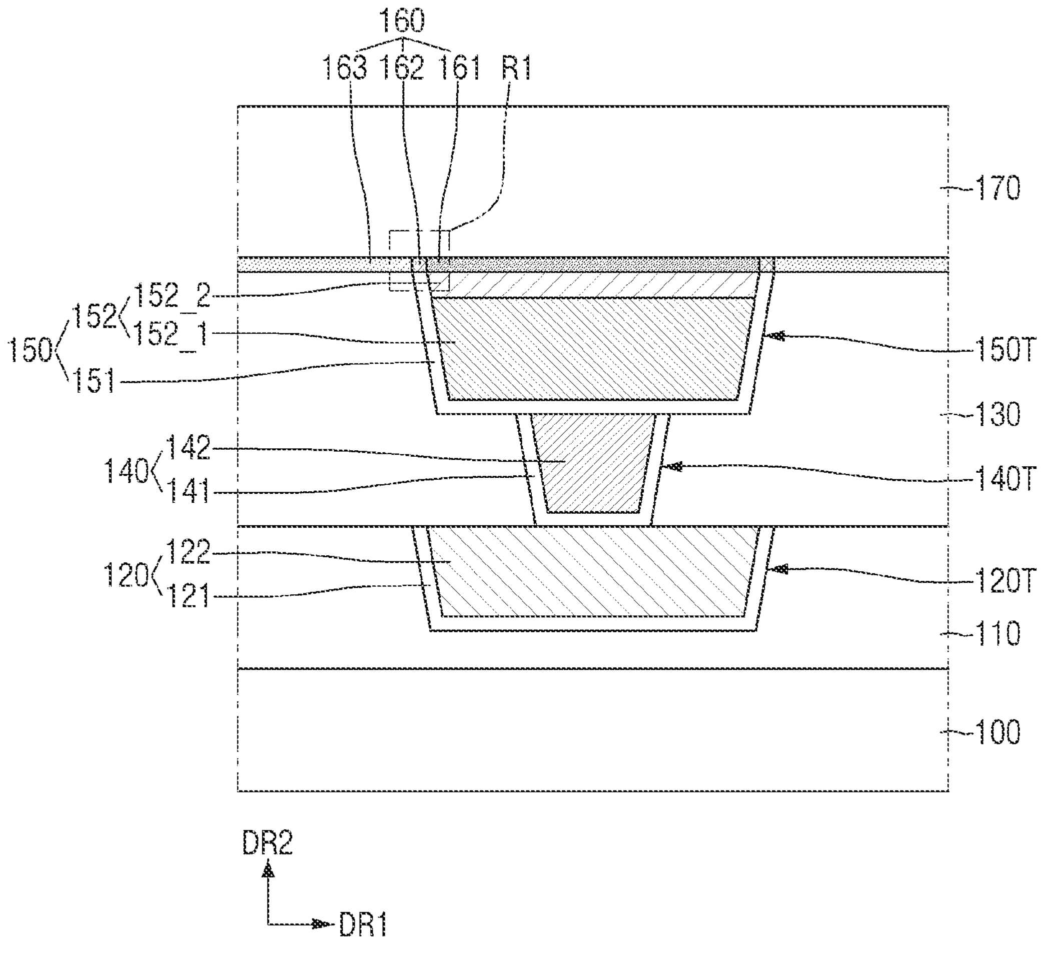
FIG. 1 is a diagram for illustrating a semiconductor device according to one or more embodiments of the present disclosure.

In the following description, like reference numerals refer to like elements throughout the specification. As used herein, a plurality of "unit", "module", "member", and "block" may be implemented as a single component or a single "unit", "module", "member", and "block" may include a plurality of components.

It will be understood that when an element is referred to as being "connected" with or to another element, it can be directly or indirectly connected to the other element.

Also, when a part "includes" or "comprises" an element, unless there is a particular description contrary thereto, the part may further include other elements, not excluding the other elements.

Throughout the description, when a member is "on" another member, this includes not only when the member is in contact with the other member, but also when there is another member between the two members.

Herein, the expressions "at least one of a, b or c" and "at least one of a, b and c" indicate "only a," "only b," "only c," "both a and b," "both a and c," "both b and c," and "all of a, b, and c."

It will be understood that, although the terms first, second, third, etc., may be used herein to describe various elements, is the disclosure should not be limited by these terms. These terms are only used to distinguish one element from another element.

As used herein, the singular forms "a," "an" and "the" are intended to include the plural forms as well, unless the context clearly indicates otherwise.

With regard to any method or process described herein, an identification code may be used for the convenience of the description but is not intended to illustrate the order of each step or operation. Each step or operation may be implemented in an order different from the illustrated order unless the context clearly indicates otherwise.

Hereinafter, a semiconductor device according to one or more embodiments of the present disclosure is described with reference to FIG. 1 and FIG. 2.

FIG. 1 is a diagram for illustrating a semiconductor device according to one or more embodiments of the present disclosure. FIG. 2 is an enlarged view of a R1 region in FIG. 1.

Figure 2:
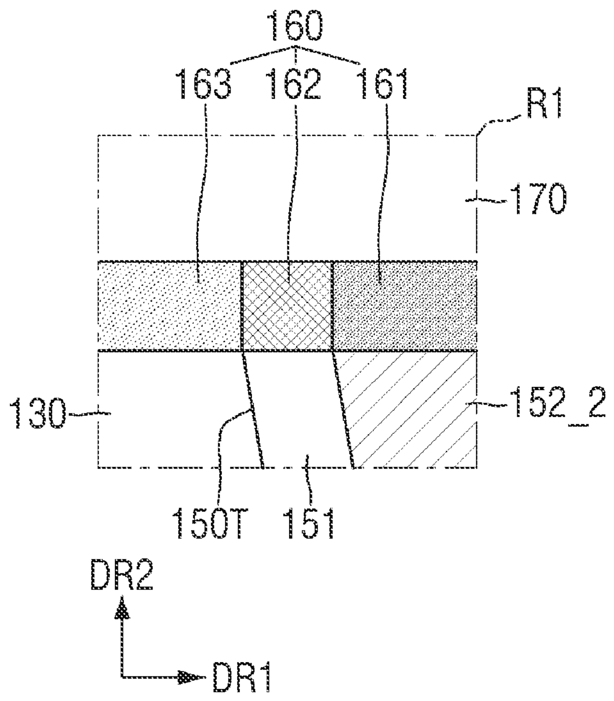
FIG. 2 is an enlarged view of a R1 region in FIG. 1.

Referring to FIG. 1 and FIG. 2, the semiconductor device according to one or more embodiments of the present disclosure includes a substrate 100, a lower interlayer insulating layer 110, a lower wiring layer 120, an interlayer insulating layer 130, a via 140, an upper wiring layer 150, a first etching stop layer 160, and an upper interlayer insulating layer 170.

The substrate 100 may have a structure in which a base substrate and an epi layer are stacked. However, the present disclosure is not limited thereto. The substrate 100 may be a silicon substrate, a gallium arsenide substrate, a silicon germanium substrate, a ceramic substrate, a quartz substrate, or a glass substrate for a display, etc., or may be a SOI (Semiconductor On Insulator) substrate.

Furthermore, the substrate 100 may include a conductive pattern. The conductive pattern may be a metal wiring, a contact, etc., or may be a gate electrode of a transistor, a source/drain of a transistor, or a diode. However, the present disclosure is not limited thereto.

Hereinafter, a horizontal direction DR1 may be defined as a direction parallel to an upper surface of the substrate 100. The vertical direction DR2 may be defined as a direction perpendicular to the horizontal direction DR1. That is, the vertical direction DR2 may be defined as a direction perpendicular to the upper surface of the substrate 100.

The lower interlayer insulating layer 110 may be disposed on the upper surface of the substrate 100. For example, the lower interlayer insulating layer 110 may include at least one of silicon oxide, silicon nitride, silicon oxynitride, and a low dielectric constant material. The low dielectric constant material may include, for example, fluorinated tetraethylorthosilicate (FTEOS), hydrogen silsesquioxane (HSQ), bisbenzocyclobutene (BCB), tetramethylorthosilicate (TMOS), octamethyleyclotetrasiloxane (OMCTS), hexamethyldisiloxane (HIMD), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or combinations thereof. However, the present disclosure is not limited thereto.

The lower wiring trench 120T may be formed in the lower interlayer insulating layer 110. The lower wiring trench 120T may be formed to be recessed from an upper surface of the lower interlayer insulating layer 110 into an inside of the lower interlayer insulating layer 110. For example, a sidewall and a bottom surface of the lower wiring trench 120T may be defined by the lower interlayer insulating layer 110. For example, a width in the horizontal direction DR1 of the lower wiring trench 120T may gradually decrease as the lower wiring trench 120T extends toward the upper surface of the substrate 100.

The lower wiring layer 120 may be disposed in the lower wiring trench 120T. That is, the lower wiring layer 120 may be disposed in the lower interlayer insulating layer 110. For example, a width in the horizontal direction DR1 of the lower wiring layer 120 may gradually decrease as the lower wiring layer 120 extends toward the upper surface of the substrate 100. For example, an upper surface of the lower wiring layer 120 may not be covered with an upper surface of the lower interlayer insulating layer 110 so as to be exposed. The lower wiring layer 120 may include a lower wiring barrier layer 121 and a lower wiring filling layer 122.

The lower wiring barrier layer 121 may be disposed along the sidewall and the bottom surface of the lower wiring trench 120T. For example, the lower wiring barrier layer 121 may be formed conformally. For example, a top surface of the lower wiring barrier layer 121 may not be covered with the upper surface of the lower interlayer insulating layer 110 so as to be exposed. The lower wiring barrier layer 121 may include, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), and combinations thereof. However, the present disclosure is not limited thereto.

The lower wiring filling layer 122 may be disposed on the lower wiring barrier layer 121 and inside the lower wiring trench 120T. The lower wiring filling layer 122 may fill an interior of the lower wiring trench 120T while being disposed on the lower wiring barrier layer 121. For example, an upper surface of the lower wiring filling layer 122 may not be covered with an upper surface of the lower interlayer insulating layer 110 so as to exposed. The lower wiring filling layer 122 may include, for example, at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), zirconium (Zr), tungsten (W), ruthenium (Ru), iridium (Ir), or rhodium (Rh). However, the present disclosure is not limited thereto.

The interlayer insulating layer 130 may be disposed on each of the upper surface of the lower interlayer insulating layer 110 and the upper surface of the lower wiring layer 120. For example, the interlayer insulating layer 130 may include at least one of silicon oxide, silicon nitride, silicon oxynitride, and a low dielectric constant material. The low dielectric constant material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or combinations thereof. However, the present disclosure is not limited thereto.

A via trench 140T may be formed in the interlayer insulating layer 130. For example, a bottom surface of the via trench 140T may be defined by the lower wiring layer 120. Furthermore, a sidewall of the via trench 140T may be defined by the interlayer insulating layer 130. For example, a width in the horizontal direction DR1 of the via trench 140T may gradually decrease as the via trench 140T extends toward the upper surface of the lower wiring layer 120.

The via 140 may be disposed in the via trench 140T. That is, the via 140 may be disposed in the interlayer insulating layer 130. For example, a width in the horizontal direction DR1 of the via 140 may gradually decrease as the via 140 extends toward the upper surface of the lower wiring layer 120. The via 140 may be connected to the lower wiring layer 120. The via 140 may include a via barrier layer 141 and a via filling layer 142.

The via barrier layer 141 may be disposed along the sidewall and the bottom surface of the via trench 140T. For example, the via barrier layer 141 may be formed conformally. The via barrier layer 141 may include, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), and combinations thereof. However, the present disclosure is not limited thereto.

The via filling layer 142 may be disposed on the via barrier layer 141 and inside the via trench 140T. The via filling layer 142 may fill an interior of the via trench 140T while being disposed on the via barrier layer 141. The via filling layer 142 may include, for example, at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), zirconium (Zr), tungsten (W), ruthenium (Ru), iridium (Ir), or rhodium (Rh). However, the present disclosure is not limited thereto.

An upper wiring trench 150T may be formed in the interlayer insulating layer 130. The upper wiring trench 150T may be formed on the via trench 140T while being disposed in the interlayer insulating layer 130. The upper wiring trench 150T may be formed to be recessed from the upper surface of the interlayer insulating layer 130 into the inside of the interlayer insulating layer 130. For example, a bottom surface of the upper wiring trench 150T may be defined by an upper surface of the via 140 and the interlayer insulating layer 130. A sidewall of the upper wiring trench 150T may be defined by the interlayer insulating layer 130. For example, a width in the horizontal direction DR1 of the bottom surface of the upper wiring trench 150T may be larger than a width in the horizontal direction DR1 of the upper surface of the via trench 140T.

The upper wiring layer 150 may be disposed in the upper wiring trench 150T. That is, the upper wiring layer 150 may be disposed in the interlayer insulating layer 130. For example, a width in the horizontal direction DR1 of the upper wiring layer 150 may gradually decrease as the upper wiring layer 150 extends toward the upper surface of the via 140. For example, an upper surface of the upper wiring layer 150 may not be covered with the upper surface of the interlayer insulating layer 130 so as to be exposed. For example, a width in the horizontal direction DR1 of the upper surface of the via 140 may be smaller than a width in the horizontal direction DR1 of the lower surface of the upper wiring layer 150. The upper wiring layer 150 may be connected to the via 140. The upper wiring layer 150 may include an upper wiring barrier layer 151 and an upper wiring filling layer 152.

The upper wiring barrier layer 151 may be disposed along the sidewall and the bottom surface of the upper wiring trench 150T. For example, the upper wiring barrier layer 151 may be formed conformally. For example, a top surface of the upper wiring barrier layer 151 may not be covered with the upper surface of the interlayer insulating layer 130 so as to be exposed. For example, the upper wiring barrier layer 151 may include, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), and combinations thereof. However, the present disclosure is not limited thereto.

The upper wiring filling layer 152 may be disposed on the upper wiring barrier layer 151 and inside the upper wiring trench 150T. The upper wiring filling layer 152 may fill an interior of the upper wiring trench 150T while being disposed on the upper wiring barrier layer 151. FIG. 1 shows that the upper surface of the upper wiring filling layer 152 is coplanar with the upper surface of the interlayer insulating layer 130. However, the present disclosure is not limited thereto. In one or more embodiments, a vertical level of the upper surface of the upper wiring filling layer 152 may be higher than that of the upper surface of the interlayer insulating layer 130. That is, at least a portion of the upper wiring filling layer 152 may protrude in the vertical direction DR2 beyond the upper surface of the interlayer insulating layer 130.

For example, the upper wiring filling layer 152 may be spaced apart from the via filling layer 142 in the vertical direction DR2. For example, the upper wiring barrier layer 151 may be disposed between the upper surface of the via filling layer 142 and the lower surface of the upper wiring filling layer 152. For example, the upper wiring filling layer 152 may include a first conductive layer 152_1 and a second conductive layer 152_2.

The first conductive layer 152_1 may fill a portion of an inner space of the upper wiring trench 150T while being disposed on the upper wiring barrier layer 151. The first conductive layer 152_1 may be in contact with a portion of the upper wiring barrier layer 151 disposed on the bottom surface of the upper wiring trench 150T. Furthermore, the first conductive layer 152_1 may be in contact with a portion of the upper wiring barrier layer 151 disposed on the sidewall of the upper wiring trench 150T. For example, a vertical level of an upper surface of the first conductive layer 152_1 may be lower than a vertical level of each of the upper surface of the interlayer insulating layer 130 and the top surface of the upper wiring barrier layer 151. However, the present disclosure is not limited thereto. In one or more embodiments, the upper surface of the first conductive layer 152_1 may be coplanar with the upper surface of the interlayer insulating layer 130.

For example, the first conductive layer 152_1 may include copper (Cu). In one or more embodiments, the first conductive layer 1521 may include at least one of carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), zirconium (Zr), tungsten (W), ruthenium (Ru), iridium (Ir), or rhodium (Rh). However, the present disclosure is not limited thereto.

The second conductive layer 152_2 may fill a remaining portion of the inner space of the upper wiring trench 150T while being disposed on the upper surface of the first conductive layer 152_1. The second conductive layer 152_2 may contact the upper surface of the first conductive layer 152_1. Furthermore, the second conductive layer 152_2 may be in contact with a portion of the upper wiring barrier layer 151 disposed on the sidewall of the upper wiring trench 150T. FIG. 1 shows that a upper surface of the second conductive layer 152_2 is coplanar with the upper surface of the interlayer insulating layer 130. However, the present disclosure is not limited thereto. In one or more embodiments, a vertical level of the upper surface of the second conductive layer 152_2 may be higher than a vertical level of the upper surface of the interlayer insulating layer 130. That is, at least a portion of the second conductive layer 152_2 may protrude in the vertical direction DR2 beyond the upper surface of the interlayer insulating layer 130.

For example, the second conductive layer 152_2 may include a different material from that of the first conductive layer 152_1. For example, the second conductive layer 152_2 may include cobalt (Co). In one or more embodiments, the second conductive layer 152_2 may include at least one of copper (Cu), carbon (C), silver (Ag), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), zirconium (Zr), tungsten (W), ruthenium (Ru), iridium (Ir), or rhodium (Rh). However, the present disclosure is not limited thereto.

The first etching stop layer 160 may be disposed on each of the upper surface of the interlayer insulating layer 130 and the upper surface of the upper wiring layer 150. For example, the first etching stop layer 160 may contact each of the upper surface of the interlayer insulating layer 130 and the upper surface of the upper wiring layer 150. For example, the first etching stop layer 160 may be formed conformally. For example, the first etching stop layer 160 may include a first portion 161, a second portion 162, and a third portion 163.

The first etching stop layer 160 may include, for example, aluminum nitride (AlN). In one or more embodiments, the first etching stop layer 160 may include, for example, at least one of aluminum oxide (AlO), hafnium oxide (HfO), zirconium oxide (ZrO), hafnium nitride (HfN), zirconium nitride (ZrN), silicon oxide ($SiO_2$), silicon nitride (SiN), silicon oxynitride (SiCN), silicon oxycarbide (SiOC), silicon carbide (SiC), or a low dielectric constant material.

The first portion 161 of the first etching stop layer 160 may be disposed on the upper surface of the upper wiring filling layer 152. For example, the first portion 161 of the first etching stop layer 160 may be disposed on the upper surface of the second conductive layer 152_2. The first portion 161 of the first etching stop layer 160 may be in contact with the upper surface of the second conductive layer 1522. The first portion 161 of the first etching stop layer 160 may overlap with the upper wiring filling layer 152 in the vertical direction DR2. For example, the first portion 161 of the first etching stop layer 160 may overlap with the second conductive layer 152_2 in the vertical direction DR2.

The second portion 162 of the first etching stop layer 160 may be disposed on the upper surface of the upper wiring barrier layer 151. The second portion 162 of the first etching stop layer 160 may be in contact with the upper surface of the upper wiring barrier layer 151. For example, the second portion 162 of the first etching stop layer 160 may contact the first portion 161 of the first etching stop layer 160. The second portion 162 of the first etching stop layer 160 may overlap the upper wiring barrier layer 151 in the vertical direction DR2.

The third portion 163 of the first etching stop layer 160 may be disposed on the upper surface of the interlayer insulating layer 130. The third portion 163 of the first etching stop layer 160 may be in contact with the upper surface of the interlayer insulating layer 130. For example, the third portion 163 of the first etching stop layer 160 may contact the second portion 162 of the first etching stop layer 160. The third portion 163 of the first etching stop layer 160 may overlap with the interlayer insulating layer 130 in the vertical direction DR2.

For example, the first portion 161 of the first etching stop layer 160 may contain nitrogen (N) atoms at a first atomic percentage (as used herein, "atomic percentage" means a percentage of nitrogen contained in a given portion of the semiconductor device described herein). The second portion 162 of the first etching stop layer 160 may contain nitrogen (N) atoms at a second atomic percentage. The third portion 163 of the first etching stop layer 160 may contain nitrogen (N) atoms at a third atomic percentage. For example, the first atomic percentage of nitrogen (N) atoms contained in the first portion 161 of the first etching stop layer 160 may be larger than the second atomic percentage of nitrogen (N) atoms contained in the second portion 162 of the first etching stop layer 160. Furthermore, the second atomic percentage of nitrogen (N) atoms contained in the second portion 162 of the first etching stop layer 160 may be greater than the third atomic percentage of nitrogen (N) atoms contained in the third portion 163 of the first etching stop layer 160. In other words, the first atomic percentage of nitrogen (N) atoms contained in the first portion 161 of the first etching stop layer 160 may be greater than the percentage of nitrogen (N) atoms contained in the third portion 163 of the first etching stop layer 160.

The upper interlayer insulating layer 170 may be disposed on the upper surface of the first etching stop layer 160. The upper interlayer insulating layer 170 may be in contact with the upper surface of the first etching stop layer 160. For example, the upper interlayer insulating layer 170 may include at least one of silicon oxide, silicon nitride, silicon oxynitride, and a low dielectric constant material. The low dielectric constant material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or combinations thereof. However, the present disclosure is not limited thereto.

Hereinafter, with reference to FIG. 1, and FIG. 3 to FIG. 10, a method for manufacturing a semiconductor device according to one or more embodiments of the present disclosure is described.

FIGS. 3 to 10 are diagrams of intermediate structures corresponding to intermediate operations of a method for manufacturing a semiconductor device according to one or more embodiments of the present disclosure.

Figure 3:
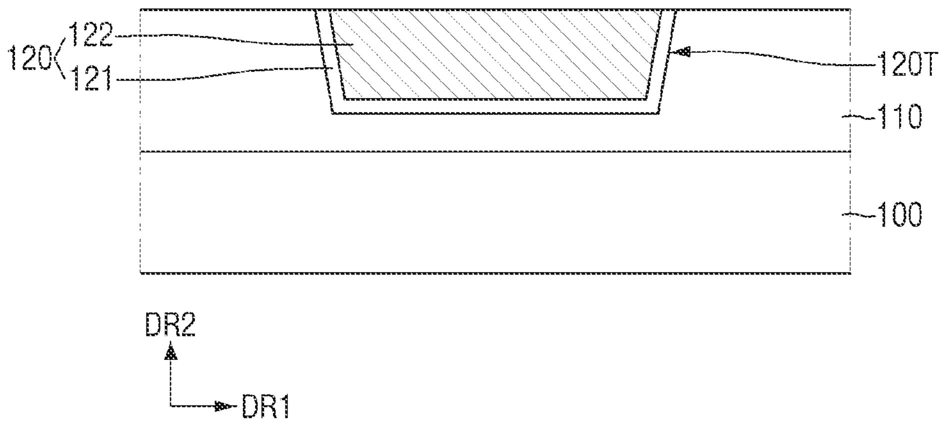
FIGS. 3, 4, 5, 6, 7, 8, 9 and 10 are diagrams of intermediate structures corresponding to intermediate operations of a method for manufacturing a semiconductor device according to one or more embodiments of the present disclosure.

Referring to FIG. 3, the lower interlayer insulating layer 110 may be formed on the upper surface of the substrate 100. Subsequently, the lower wiring trench 120T may be formed in the lower interlayer insulating layer 110. The lower wiring trench 120T may be formed to be recessed from the upper surface of the lower interlayer insulating layer 110 into the inside of the lower interlayer insulating layer 110.

Subsequently, the lower wiring layer 120 including the lower wiring barrier layer 121 and the lower wiring filling layer 122 may be formed in the lower wiring trench 120T. The lower wiring barrier layer 121 may be formed along the sidewall and the bottom surface of the lower wiring trench 120T. For example, the lower wiring barrier layer 121 may be formed conformally. The lower wiring filling layer 122 may fill the inside of the lower wiring trench 120T while being disposed on the lower wiring barrier layer 121.

Figure 4:
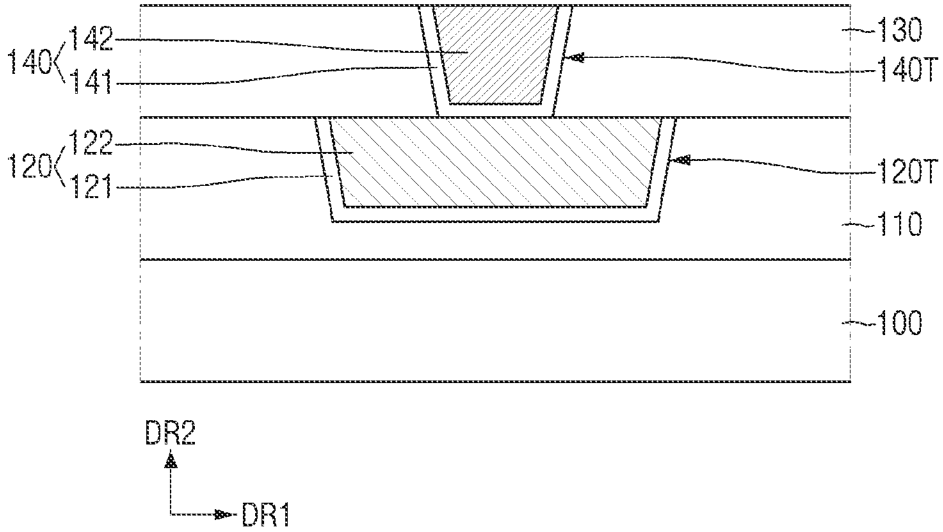

Referring to FIG. 4, the interlayer insulating layer 130 may be formed on each of the upper surface of the lower interlayer insulating layer 110 and the upper surface of the lower wiring layer 120. Subsequently, the via trench 140T may be formed in the interlayer insulating layer 130. The via trench 140T may be formed to be recessed from the upper surface of the interlayer insulating layer 130 into the inside of the interlayer insulating layer 130. For example, the via trench 140T may expose the upper surface of the lower wiring layer 120.

Subsequently, the via 140 including the via barrier layer 141 and the via filling layer 142 may be formed in the via trench 140T. The via barrier layer 141 may be formed along the sidewall and the bottom surface of the via trench 140T. For example, the via barrier layer 141 may be formed conformally. The via filling layer 142 may fill the inside of the via trench 140T while being disposed on the via barrier layer 141.

Figure 5:
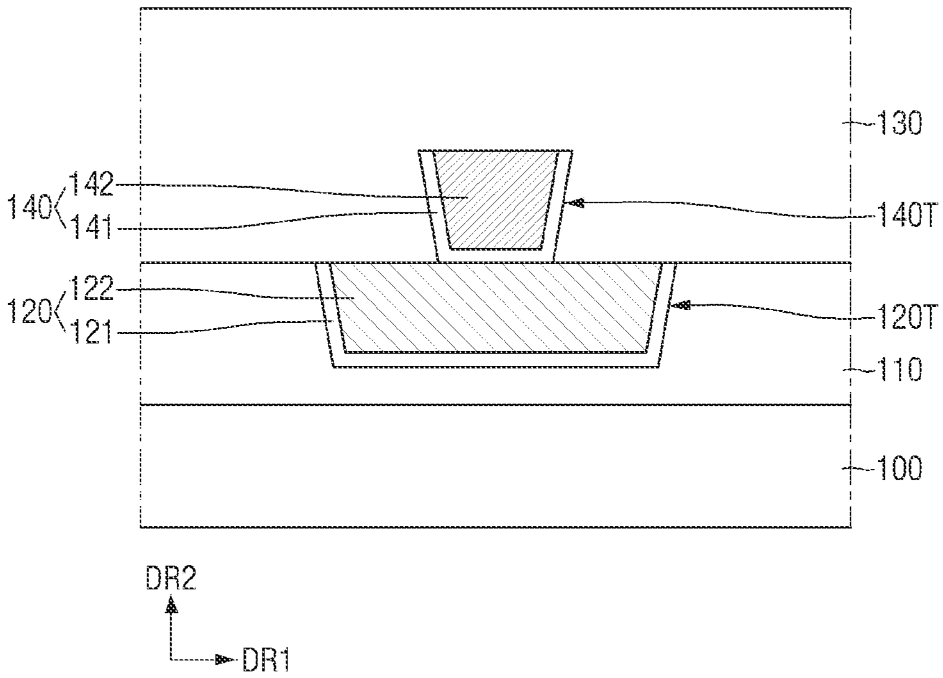

Referring to FIG. 5, the interlayer insulating layer 130 may be additionally formed on each of the upper surface of the interlayer insulating layer 130 and the upper surface of the via 140. The additionally formed interlayer insulating layer 130 may cover the upper surface of the via 140.

Figure 6:
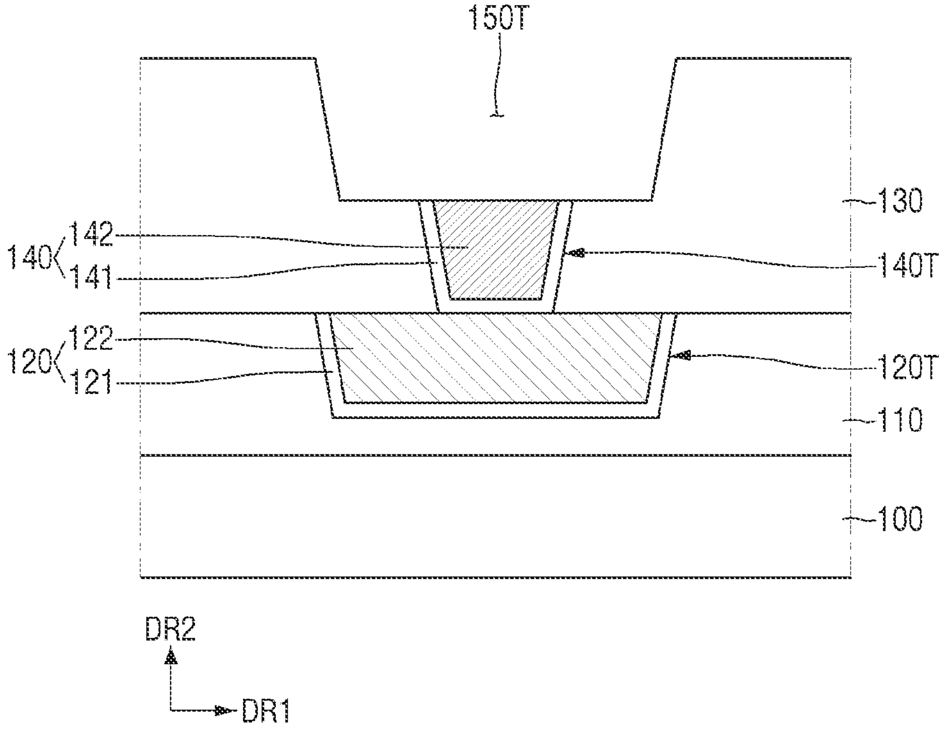

Referring to FIG. 6, the upper wiring trench 150T may be formed on the upper surface of the via 140 and inside the interlayer insulating layer 130. The upper wiring trench 150T may be formed to be recessed from the upper surface of the interlayer insulating layer 130 into the inside of the interlayer insulating layer 130. For example, the upper wiring trench 150T may expose the upper surface of the via 140.

Figure 7:
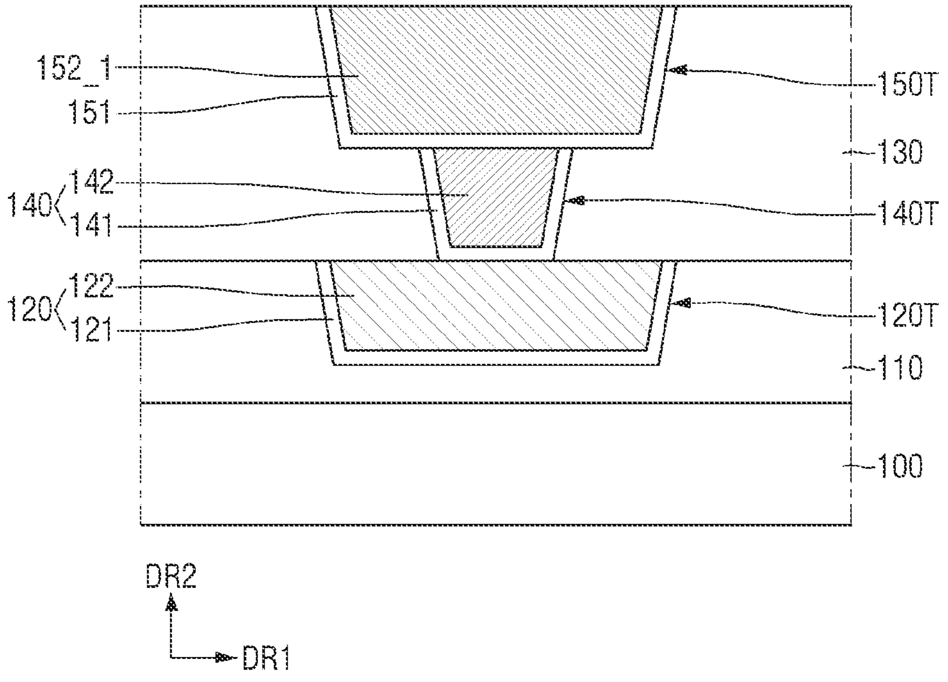

Referring to FIG. 7, the upper wiring barrier layer 151 and the first conductive layer 152_1 may be formed in the upper wiring trench 150T. The upper wiring barrier layer 151 may be formed along the sidewall and the bottom surface of the upper wiring trench 150T. For example, the upper wiring barrier layer 151 may be formed conformally. The first conductive layer 152_1 may fill the inside of the upper wiring trench 150T while being disposed on the upper wiring barrier layer 151.

Figure 8:
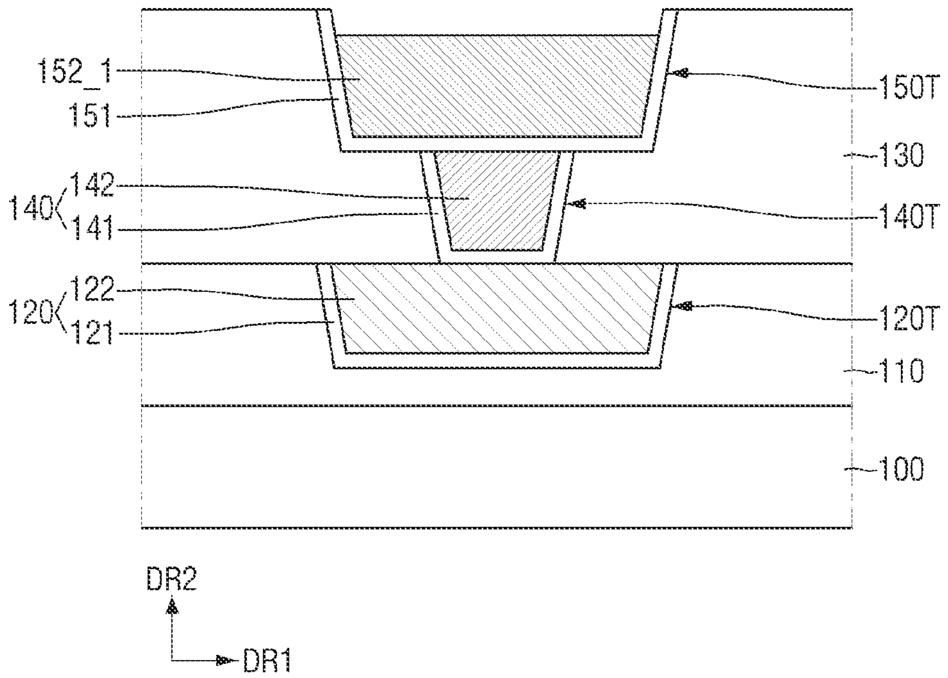

Referring to FIG. 8, a portion of the first conductive layer 152_1 may be etched. Thus, a vertical level of the upper surface of the first conductive layer 152_1 may be lower than that of each of the upper surface of the interlayer insulating layer 130 and the upper surface of the upper wiring barrier layer 151. For example, a portion of the sidewall of the upper wiring barrier layer 151 may not be covered with the upper surface of the first conductive layer 152_1 so as to be exposed.

Figure 9:
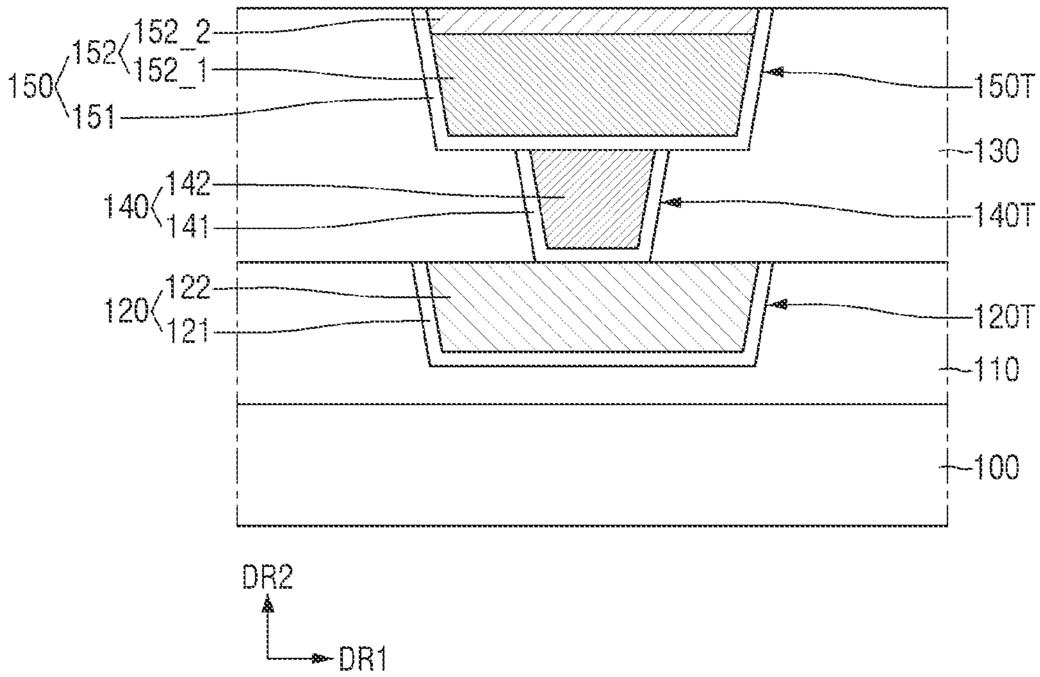

Referring to FIG. 9, the second conductive layer 152_2 may be formed in a space obtained by removing the portion of the first conductive layer 1521. As a result, the upper wiring layer 150 including the upper wiring barrier layer 151, the first conductive layer 152_1, and the second conductive layer 152_2 may be formed in the upper wiring trench 150T. For example, the upper surface of the second conductive layer 152_2 may be coplanar with the upper surface of the interlayer insulating layer 130. However, the present disclosure is not limited thereto.

Figure 10:
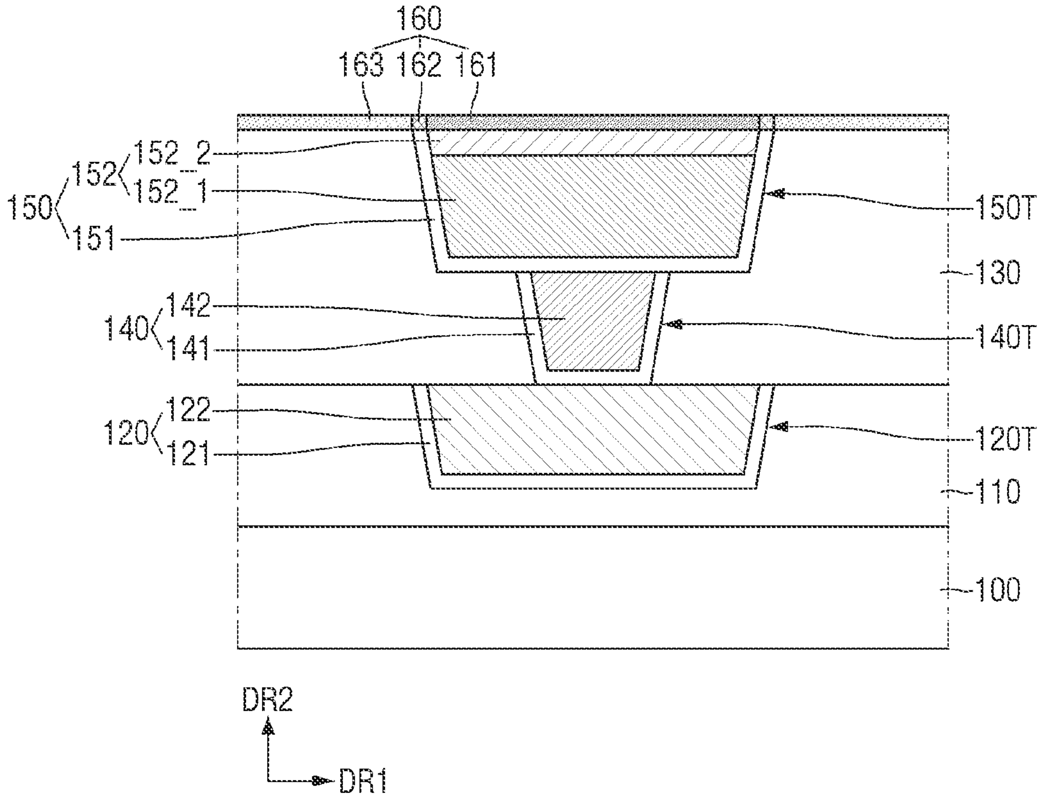

Referring to FIG. 10, the first etching stop layer 160 may be formed on each of the upper surface of the interlayer insulating layer 130 and the upper surface of the upper wiring layer 150. For example, a process in which the first etching stop layer 160 is formed is as follows.

For example, a first process gas containing $NH_3$ may be supplied onto each of the upper surface of the interlayer insulating layer 130, the upper surface of the upper wiring barrier layer 151, and the upper surface of the upper wiring filling layer 152. For example, the first process gas containing $NH_3$ may react with the surface of the upper wiring barrier layer 151 to produce a —$NH_2$ functional group in the surface of the upper wiring barrier layer 151. Subsequently, a second process gas containing TMA (trimethylaluminum) may be supplied onto the surface of the upper wiring barrier layer 151 on which the —$NH_2$ functional group has been produced. Subsequently, the —$NH_2$ functional group present on the surface of the upper wiring barrier layer 151 may bind to TMA (trimethylaluminum), thereby forming the first etching stop layer including aluminum nitride (AlN) on the surface of the upper wiring barrier layer 151. 160.

Referring to FIG. 1, the upper interlayer insulating layer 170 may be formed on the upper surface of the first etching stop layer 160. As a result of the manufacturing process described herein, the semiconductor device as shown in FIG. 1 may be manufactured.

The method for manufacturing the semiconductor device according to one or more embodiments of the present disclosure includes, before the first etching stop layer 160 is formed, applying the first process gas containing $NH_3$ to the surface of the upper wiring barrier layer 151 to produce the —$NH_2$ functional group in the surface of the upper wiring barrier layer 151. For this reason, the method for manufacturing the semiconductor device according to one or more embodiments of the present disclosure may prevent a void from being generated between the surface of the upper wiring barrier layer 151 and the first etching stop layer 160. Thus, the reliability of the upper wiring layer 150 may be improved.

In the semiconductor device according to one or more embodiments of the present disclosure manufactured by this manufacturing method, the atomic percentage of nitrogen (N) atoms contained in the first portion 161 of the first etching stop layer 160 formed on the upper surface of the upper wiring filling layer 152, the atomic percentage of nitrogen (N) atoms contained in the second portion 162 of the first etching stop layer 160 formed on the upper surface of the upper wiring barrier layer 151, and the atomic percentage of nitrogen (N) atoms contained in the third portion 163 of the first etching stop layer 160 formed on the upper surface of the interlayer insulating layer 130 may be different from each other.

For example, in the semiconductor device according to one or more embodiments of the present disclosure, the first atomic percentage of nitrogen (N) atoms contained in the first portion 161 of the first etching stop layer 160 may be larger than the second atomic percentage of nitrogen (N) atoms contained in the second portion 162 of the first etching stop layer 160. Furthermore, the second atomic percentage of nitrogen (N) atoms contained in the second portion 162 of the first etching stop layer 160 may be greater than the third atomic percentage of nitrogen (N) atoms contained in the third portion 163 of the first etching stop layer 160.

Hereinafter, a semiconductor device according to one or more embodiments of the present disclosure is described with reference to FIG. 11 and FIG. 12. Differences between this embodiment and the semiconductor device as shown in FIG. 1 and FIG. 2 will be mainly described.

Figure 11:
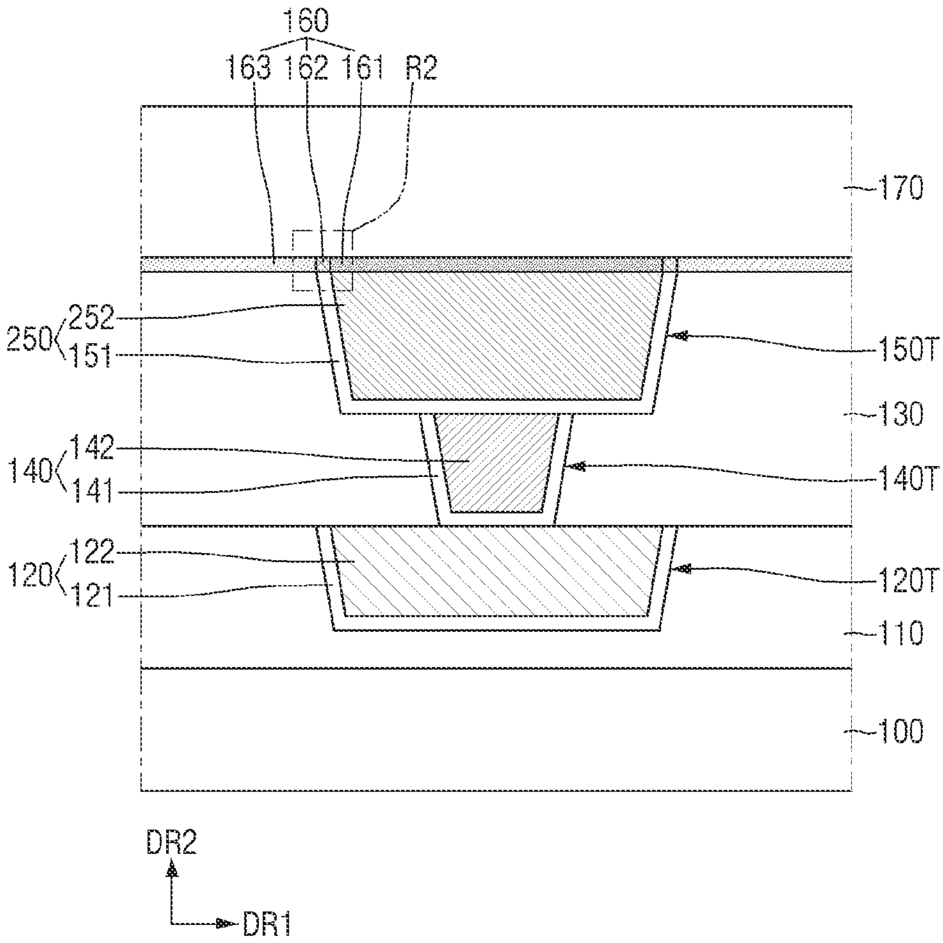
FIG. 11 is a diagram for illustrating a semiconductor device according to one or more embodiments of the present disclosure.

FIG. 11 is a diagram for illustrating a semiconductor device according to one or more embodiments of the present disclosure. FIG. 12 is an enlarged view of a R2 region in FIG. 11.

Figure 12:
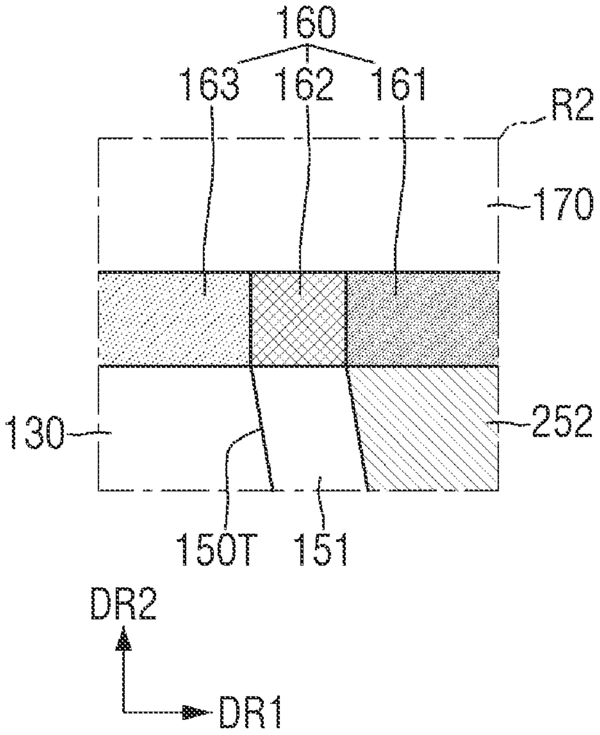
FIG. 12 is an enlarged view of a R2 region in FIG. 11.

Referring to FIG. 11 and FIG. 12, in the semiconductor device according to one or more embodiments of the present disclosure, an upper wiring filling layer 252 may be formed as a single film. For example, an upper wiring layer 250 may include the upper wiring barrier layer 151 and the upper wiring filling layer 252.

The upper wiring barrier layer 151 may be disposed along the sidewall and the bottom surface of the upper wiring trench 150T. The upper wiring filling layer 252 may fill the inside of the upper wiring trench 150T while being disposed on the upper wiring barrier layer 151.

For example, the upper wiring filling layer 252 may be formed as a single film. That is, a portion of the upper wiring filling layer 252 in contact with the upper wiring barrier layer 151 and a remaining portion of the upper wiring filling layer 252 in contact with the first portion 161 of the first etching stop layer 160 may include the same material. For example, the upper wiring filling layer 252 may include cobalt (Co). In one or more embodiments, the upper wiring filling layer 252 may include at least one of copper (Cu), carbon (C), silver (Ag), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), zirconium (Zr), tungsten (W), ruthenium (Ru), iridium (Ir), or rhodium (Rh). However, the present disclosure is not limited thereto.

Hereinafter, with reference to FIG. 13 and FIG. 14, a semiconductor device according to one or more embodiments of the present disclosure is described. Differences between this embodiment and the semiconductor device as shown in FIG. 1 and FIG. 2 will be mainly described.

Figure 13:
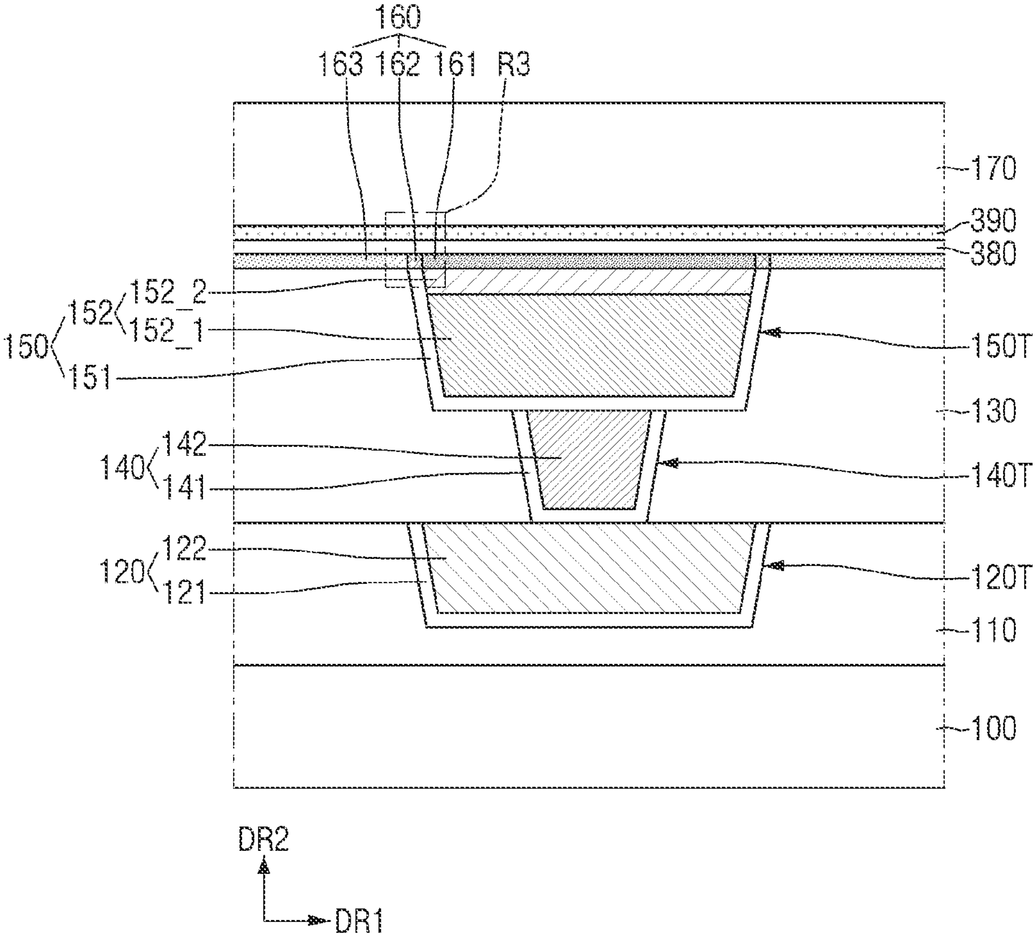
FIG. 13 is a diagram for illustrating a semiconductor device according to one or more embodiments of the present disclosure.

FIG. 13 is a diagram for illustrating a semiconductor device according to one or more embodiments of the present disclosure. FIG. 14 is an enlarged view of a R3 region in FIG. 13.

Figure 14:
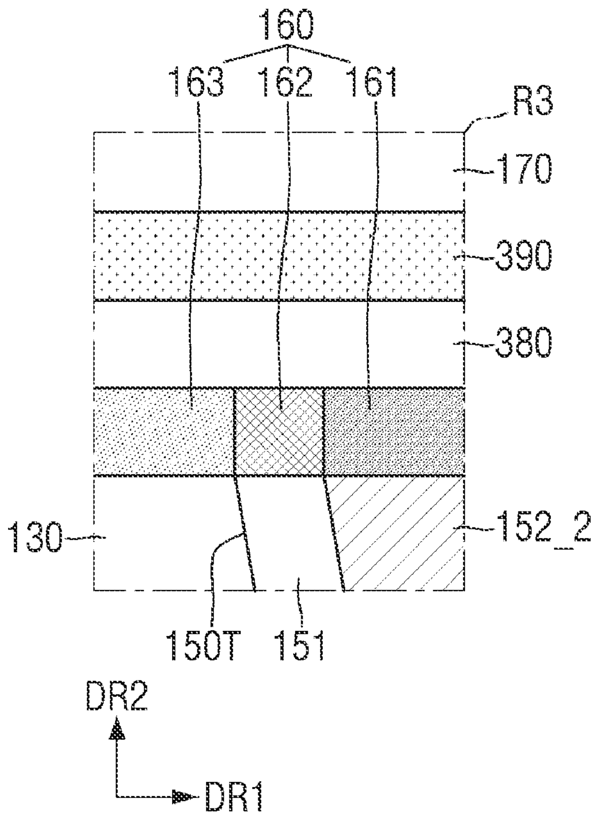
FIG. 14 is an enlarged view of a R3 region in FIG. 13.

Referring to FIG. 13 and FIG. 14, in the semiconductor device according to one or more embodiments of the present disclosure, an etching stop layer including the first etching stop layer 160 may be formed as a stack of triple films.

For example, a second etching stop layer 380 and a third etching stop layer 390 may be sequentially disposed on the upper surface of the first etching stop layer 160. That is, the second etching stop layer 380 in contact with the upper surface of the first etching stop layer 160 may be disposed on the upper surface of the first etching stop layer 160. Furthermore, the third etching stop layer 390 in contact with an upper surface of the second etching stop layer 380 may be disposed on the upper surface of the second etching stop layer 380.

For example, the first etching stop layer 160 may include aluminum nitride (AlN). In one or more embodiments, the first etching stop layer 160 may include aluminum oxide (AlO). For example, the third etching stop layer 390 may include aluminum nitride (AlN). In one or more embodiments, the third etching stop layer 390 may include aluminum oxide (AlO). The second etching stop layer 380 may include a different material from that of each of the first etching stop layer 160 and the third etching stop layer 390. For example, the second etching stop layer 380 may include one of silicon oxide ($SiO_2$), silicon nitride (SiN), silicon oxynitride (SiCN), silicon oxycarbide (SiOC), and silicon carbide (SiC).

For example, the third etching stop layer 390 may contain nitrogen (N) atoms at a fourth atomic percentage. For example, the fourth atomic percentage of nitrogen (N) atoms contained in the third etching stop layer 390 may be smaller than the first atomic percentage of nitrogen (N) atoms contained in the first portion 161 of the first etching stop layer 160. Furthermore, the fourth atomic percentage of nitrogen (N) atoms contained in the third etching stop layer 390 may be smaller than the second atomic percentage of nitrogen (N) atoms contained in the second portion 162 of the first etching stop layer 160.

Hereinafter, with reference to FIG. 15, a semiconductor device according to one or more embodiments of the present disclosure is described. Differences between this embodiment and the semiconductor device as shown in FIG. 1 and FIG. 2 will be mainly described.

Figure 15:
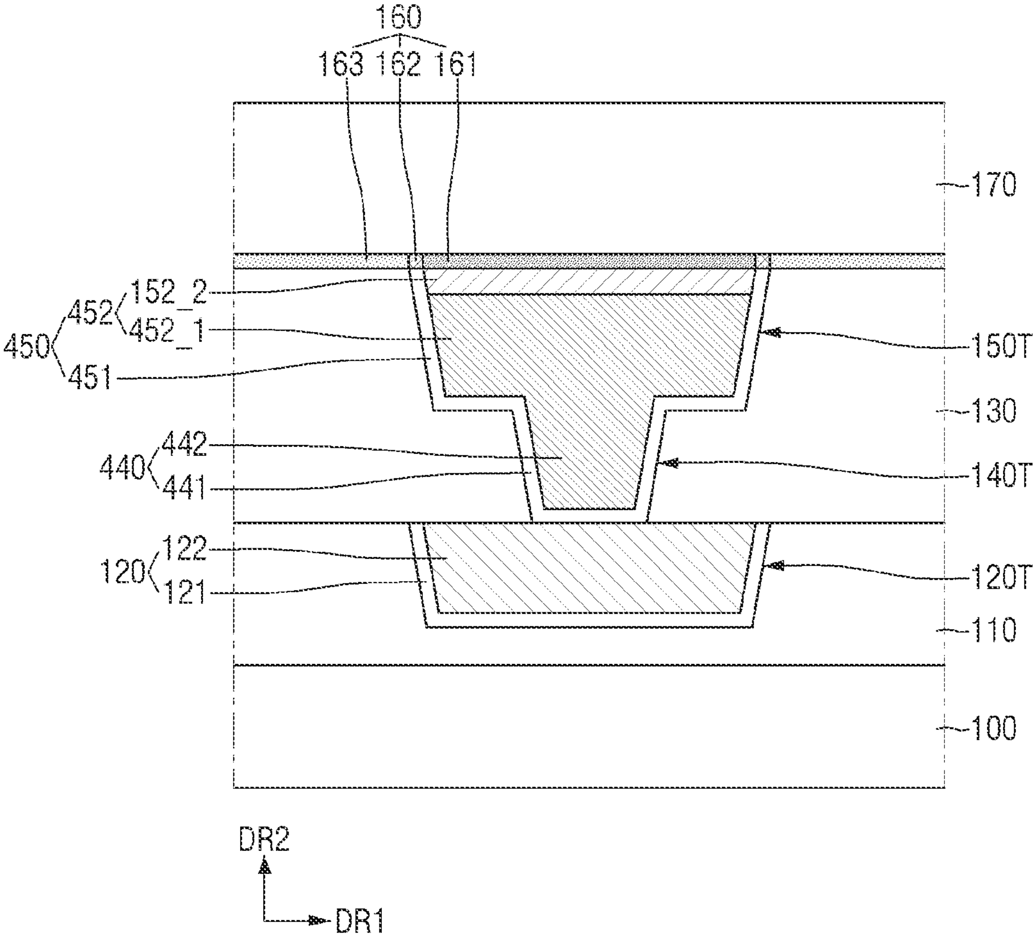
FIG. 15 is a diagram for illustrating a semiconductor device according to one or more embodiments of the present disclosure.

FIG. 15 is a diagram for illustrating a semiconductor device according to one or more embodiments of the present disclosure.

Referring to FIG. 15, in a semiconductor device according to one or more embodiments of the present disclosure, an upper wiring layer 450 and a via 440 may be formed in a dual damascene process.

For example, the via 440 may include the via barrier layer 441 and the via filling layer 442. The via barrier layer 441 may be disposed along a sidewall and a bottom surface of the via trench 140T. The via filling layer 442 may fill the inside of the via trench 140T while being disposed on the via barrier layer 441.

For example, the upper wiring layer 450 may include an upper wiring barrier layer 451 and an upper wiring filling layer 452. The upper wiring barrier layer 451 may be disposed along a sidewall and a portion of a bottom surface of the upper wiring trench 150T. For example, the upper wiring barrier layer 451 and the via barrier layer 441 may be formed integrally with each other and may be monolithic. The upper wiring filling layer 452 may fill the inside of the upper wiring trench 150T while being disposed on the upper wiring barrier layer 451. An upper surface of the via filling layer 442 may be in contact with a lower surface of the upper wiring filling layer 452.

For example, the upper wiring filling layer 452 may include a first conductive layer 452_1 and a second conductive layer 152_2. The first conductive layer 452_1 may fill the inside of the upper wiring trench 150T while being disposed on the upper wiring barrier layer 451. An upper surface of the via filling layer 442 may be in contact with a lower surface of the first conductive layer 4521. For example, the via filling layer 442 and the first conductive layer 452_1 may be formed integrally with each other and may be monolithic. The second conductive layer 1522 may fill the remaining portion of the upper wiring trench 150T while being disposed on an upper surface of the first conductive layer 452_1. The second conductive layer 152_2 may contact the upper surface of the first conductive layer 452_1. For example, an upper surface of the second conductive layer 1522 may contact a lower surface of the first portion 161 of the first etching stop layer 160.

Hereinafter, with reference to FIGS. 15 to 21, a method for manufacturing a semiconductor device according to one or more embodiments of the present disclosure is described.

Figure 16:
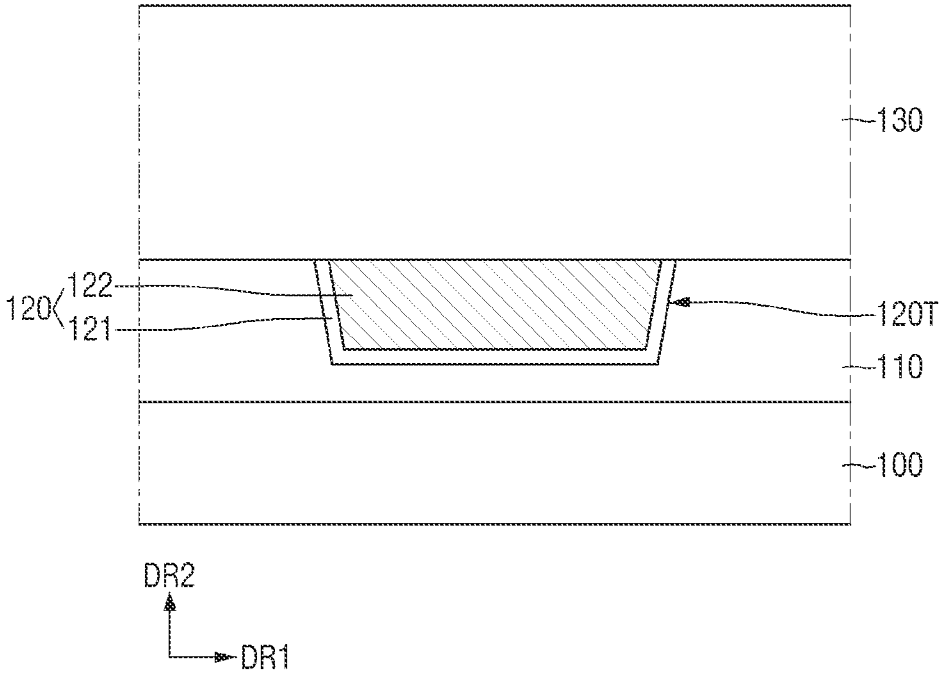
FIGS. 16, 17, 18, 19, 20 and 21 are diagrams of intermediate structures corresponding to intermediate operations of a method for manufacturing a semiconductor device according to one or more embodiments of the present disclosure.

Referring to FIG. 16, the lower interlayer insulating layer 110 may be formed on the upper surface of the substrate 100. Subsequently, the lower wiring trench 120T may be formed in the lower interlayer insulating layer 110. The lower wiring trench 120T may be formed to be recessed from the upper surface of the lower interlayer insulating layer 110 into the inside of the lower interlayer insulating layer 110.

Subsequently, the lower wiring layer 120 including the lower wiring barrier layer 121 and the lower wiring filling layer 122 may be formed in the lower wiring trench 120T. The lower wiring barrier layer 121 may be formed along the sidewall and the bottom surface of the lower wiring trench 120T. For example, the lower wiring barrier layer 121 may be formed conformally. The lower wiring filling layer 122 may fill the inside of the lower wiring trench 120T while being disposed on the lower wiring barrier layer 121. Subsequently, the interlayer insulating layer 130 may be formed on each of the upper surface of the lower interlayer insulating layer 110 and the upper surface of the lower wiring layer 120.

Figure 17:
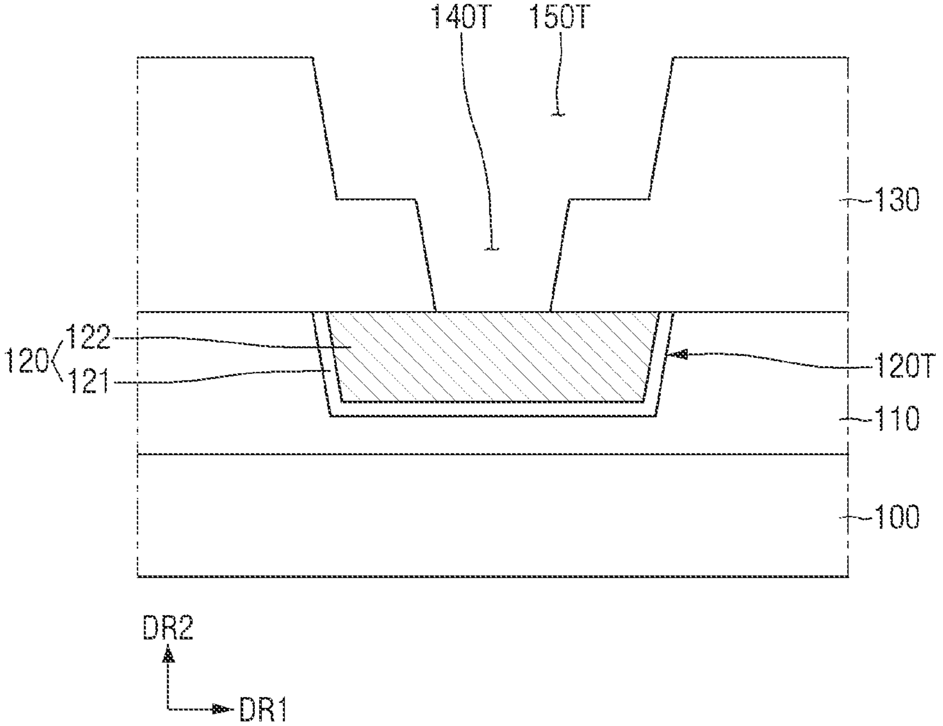

Referring to FIG. 17, each of the via trench 140T and the upper wiring trench 150T may be formed in the interlayer insulating layer 130. The upper wiring trench 150T may be formed on top of the via trench 140T. For example, a width in the horizontal direction DR1 of the upper wiring trench 150T may be larger than a width in the horizontal direction DR1 of the via trench 140T. The upper surface of the lower wiring layer 120 may be exposed through the via trench 140T and upper wiring trench 150T.

Figure 18:
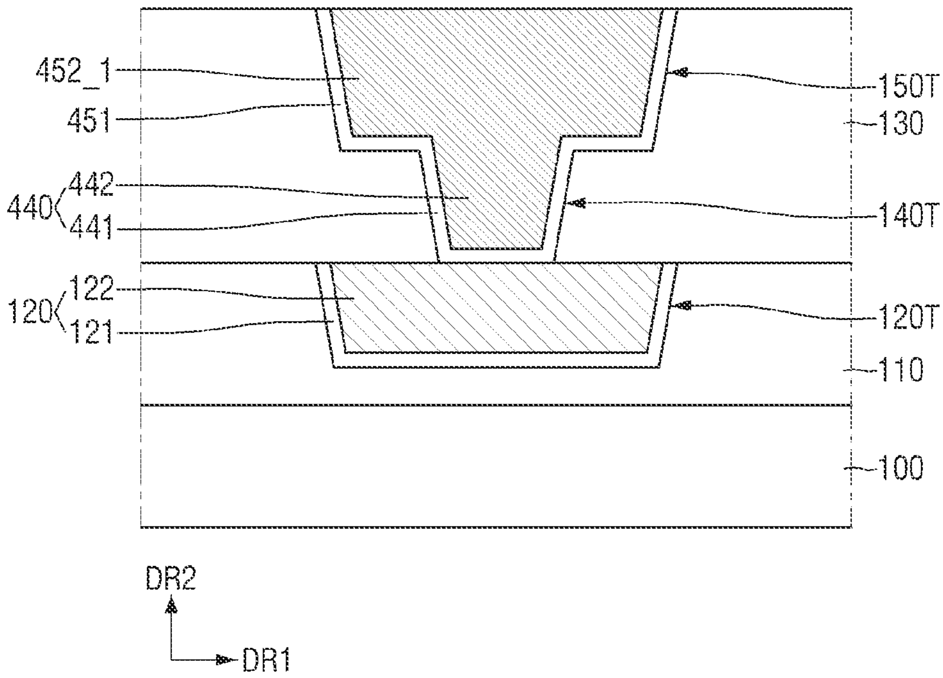

Referring to FIG. 18, the via 440 including the via barrier layer 441 and the via filling layer 442 may be formed in the via trench 140T. For example, the via barrier layer 441 may be formed along the sidewall and the bottom surface of the via trench 140T. The via filling layer 442 may fill the inside of the via trench 140T while being disposed on the via barrier layer 441.

Furthermore, the upper wiring barrier layer 451 and the first conductive layer 452_1 may be formed in the upper wiring trench 150T. For example, the upper wiring barrier layer 451 may be formed along the sidewall and the portion of the bottom surface of the upper wiring trench 150T. The upper wiring filling layer 452 may fill the inside of the upper wiring trench 150T while being disposed on the upper wiring barrier layer 451. The upper surface of the via filling layer 442 may be in contact with the lower surface of the upper wiring filling layer 452.

The via barrier layer 441 and the upper wiring barrier layer 451 may be formed integrally with each other and may be monolithic. For example, the via barrier layer 441 and the upper wiring barrier layer 451 may be formed in the same manufacturing process. The via filling layer 442 and the first conductive layer 4521 may be formed integrally with each other and may be monolithic. For example, the via filling layer 442 and the first conductive layer 452_1 may be formed in the same manufacturing process.

Figure 19:
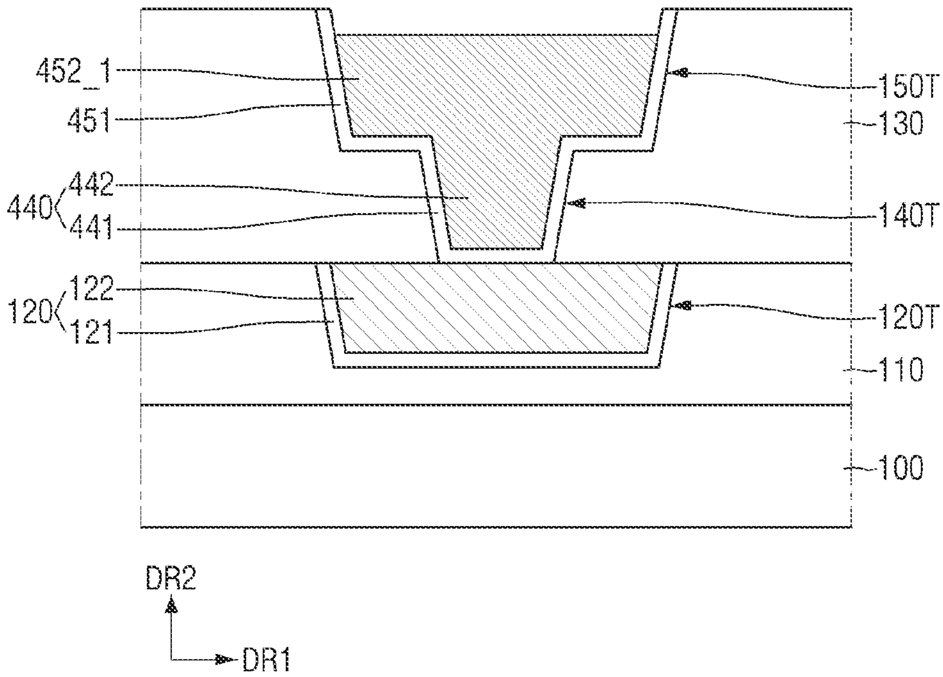

Referring to FIG. 19, a portion of the first conductive layer 452_1 may be etched. Thus, a vertical level of the upper surface of the first conductive layer 452_1 may be lower than that of each of the upper surface of the interlayer insulating layer 130 and the upper surface of the upper wiring barrier layer 451. For example, a portion of the sidewall of the upper wiring barrier layer 451 may not be covered with the upper surface of the first conductive layer 452_1 so as to be exposed.

Figure 20:
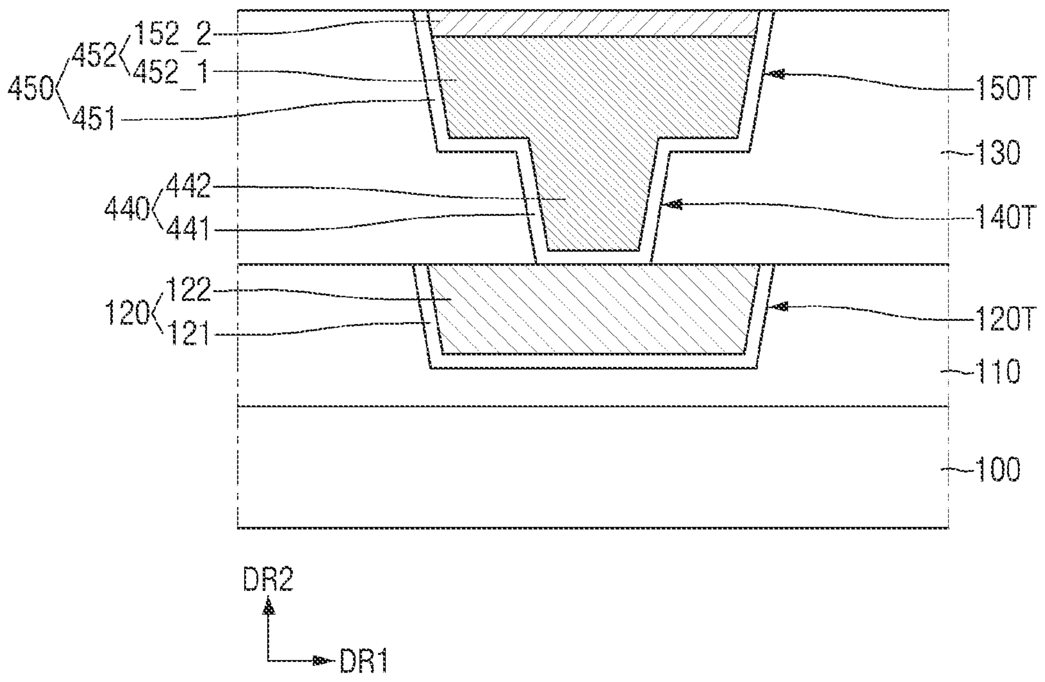

Referring to FIG. 20, the second conductive layer 152_2 may be formed in a space obtained by etching the portion of the first conductive layer 452_1. As a result, the upper wiring layer 450 including the upper wiring barrier layer 451, the first conductive layer 452_1, and the second conductive layer 1522 may be formed in the upper wiring trench 150T. For example, the upper surface of the second conductive layer 1522 may be coplanar with the upper surface of the interlayer insulating layer 130. However, the present disclosure is not limited thereto.

Figure 21:
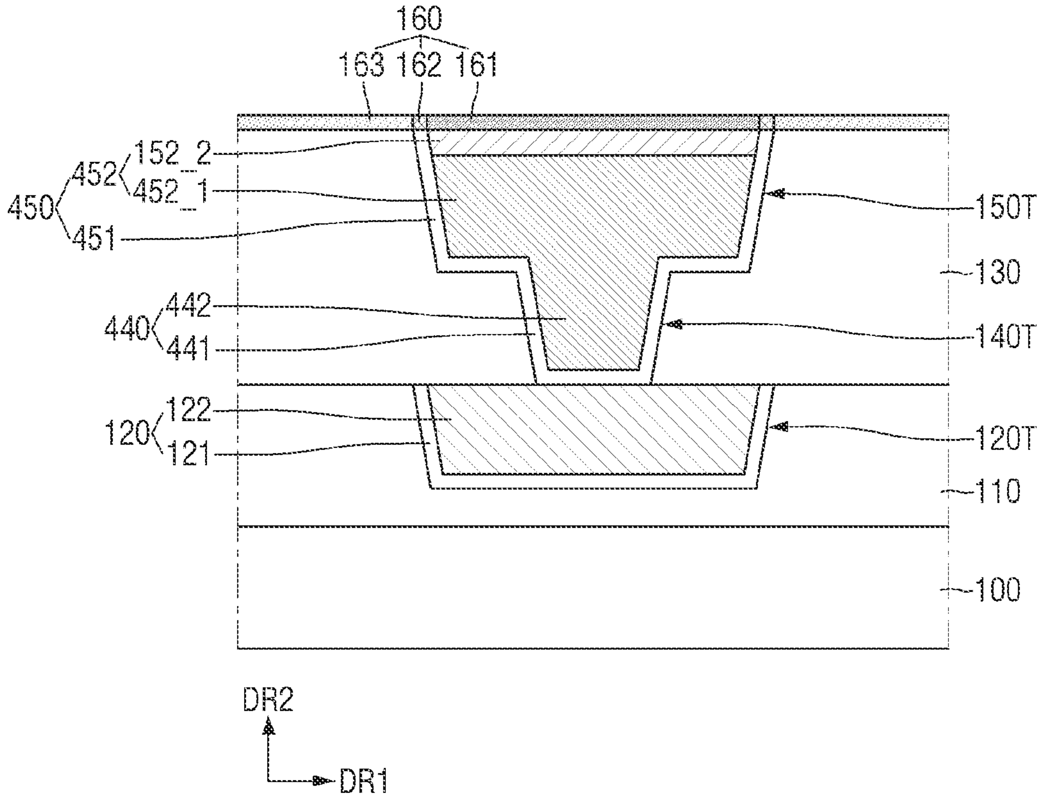

Referring to FIG. 21, the first etching stop layer 160 may be formed on each of the upper surface of the interlayer insulating layer 130 and the upper surface of the upper wiring layer 450. A process in which the first etching stop layer 160 as shown in FIG. 21 is formed is the same as the process in which the first etching stop layer 160 as shown in FIG. 10 is formed. Therefore, a detailed description of the process in which the first etching stop layer 160 as shown in FIG. 21 is formed is omitted.

Referring to FIG. 15, the upper interlayer insulating layer 170 may be formed on the upper surface of the first etching stop layer 160. In this manufacturing process, the semiconductor device as shown in FIG. 15 may be manufactured.

Hereinafter, with reference to FIG. 22, a semiconductor device according to one or more embodiments of the present disclosure is described. Differences between this embodiment and the semiconductor device as shown in FIG. 15 will be mainly described.

Figure 22:
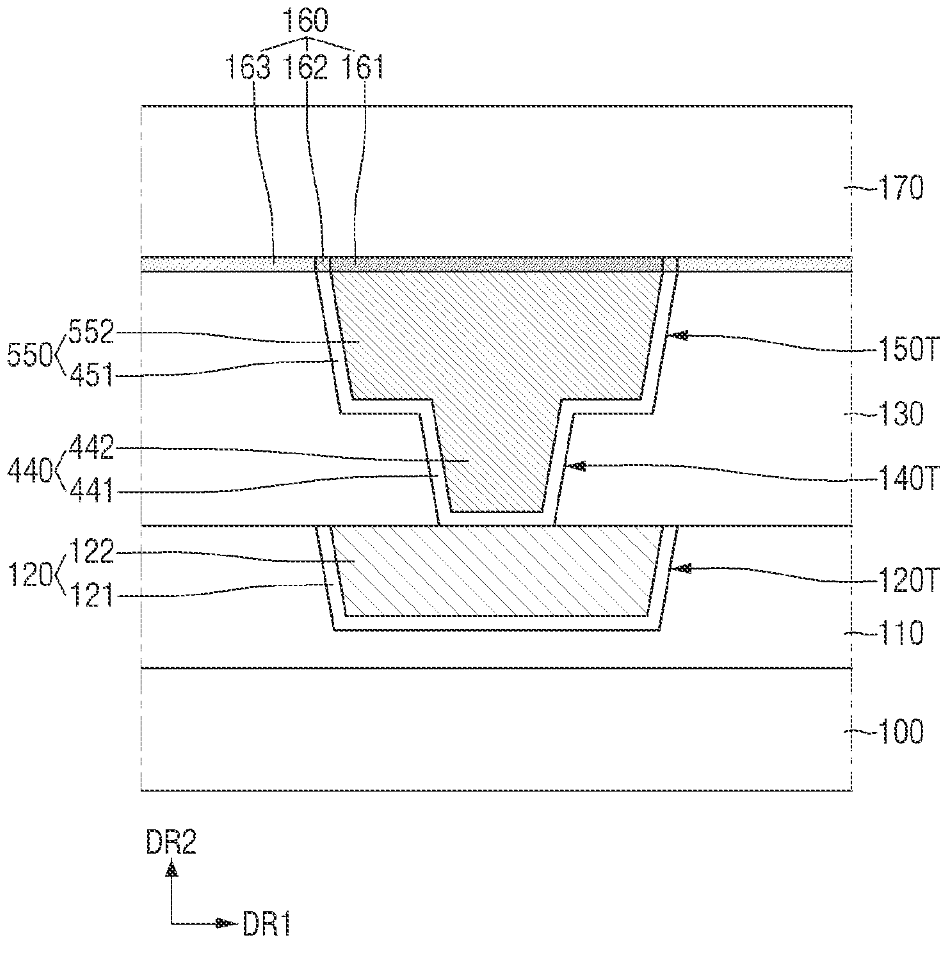
FIG. 22 is a diagram for illustrating a semiconductor device according to one or more embodiments of the present disclosure.

FIG. 22 is a diagram for illustrating a semiconductor device according to one or more embodiments of the present disclosure.

Referring to FIG. 22, in a semiconductor device according to one or more embodiments of the present disclosure, an upper wiring layer 550 and the via 440 may be formed in a dual damascene process. Furthermore, the upper wiring filling layer 552 may be formed as a single film. For example, the upper wiring layer 550 may include the upper wiring barrier layer 451 and an upper wiring filling layer 552. The upper wiring filling layer 552 and the via filling layer 442 may be formed integrally with each other and may be monolithic. That is, a combination of the upper wiring filling layer 552 and the via filling layer 442 may be formed as a single film. For example, the upper surface of the upper wiring filling layer 552 may contact the lower surface of the first portion 161 of the first etching stop layer 160.

For example, each of the upper wiring filling layer 552 and the via filling layer 442 may include cobalt (Co). In one or more embodiments, each of the upper wiring filling layer 552 and the via filling layer 442 may include, for example, at least one of copper (Cu), carbon (C), silver (Ag), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), zirconium (Zr), tungsten (W), ruthenium (Ru), iridium (Ir), or rhodium (Rh). However, the present disclosure is not limited thereto.

Hereinafter, with reference to FIG. 23, a semiconductor device according to one or more embodiments of the present disclosure is described. Differences between this embodiment and the semiconductor device as shown in FIG. 15 will be mainly described.

Figure 23:
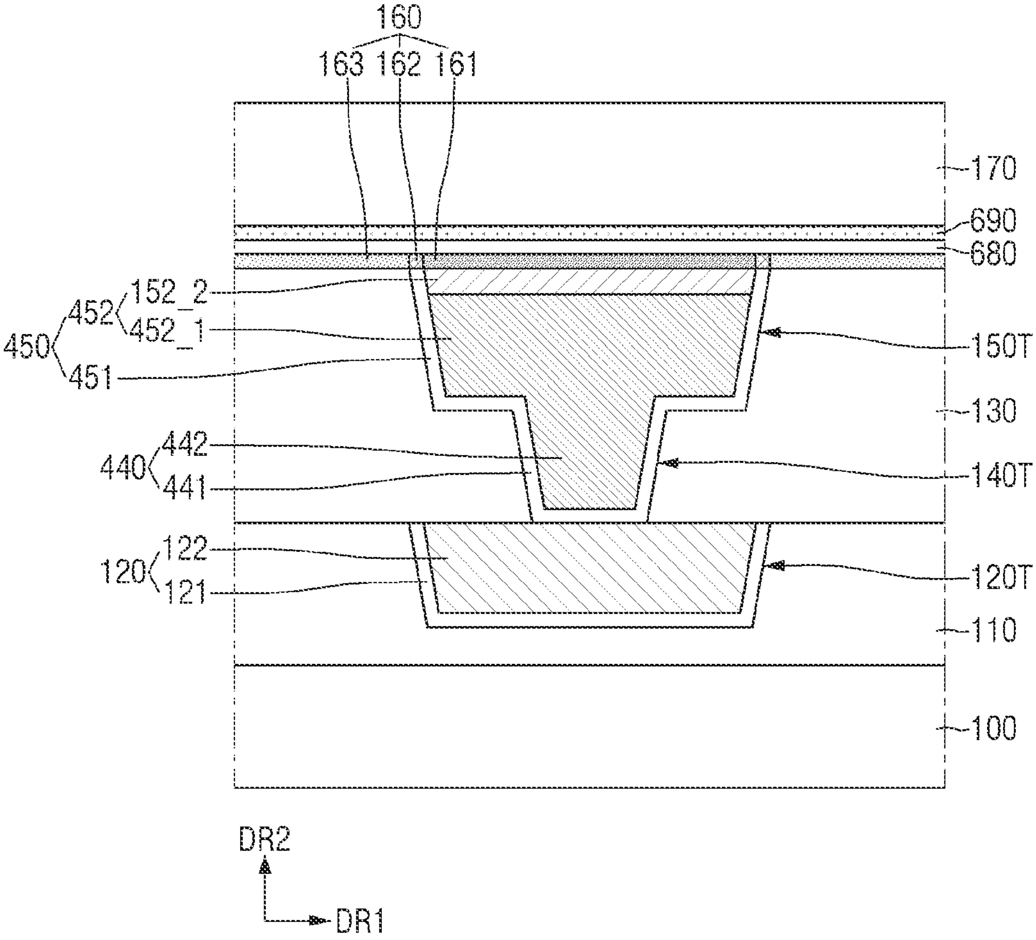
FIG. 23 is a diagram for illustrating a semiconductor device according to one or more embodiments of the present disclosure.

FIG. 23 is a diagram for illustrating a semiconductor device according to one or more embodiments of the present disclosure.

Referring to FIG. 23, in a semiconductor device according to one or more embodiments of the present disclosure, the upper wiring layer 450 and the via 440 may be formed in a dual damascene process. Furthermore, the etching stop layer including the first etching stop layer 160 may be formed as a stack of triple films.

For example, a second etching stop layer 680 and a third etching stop layer 690 may be sequentially disposed on the upper surface of the first etching stop layer 160. That is, the second etching stop layer 680 in contact with the upper surface of the first etching stop layer 160 may be disposed on the upper surface of the first etching stop layer 160. Furthermore, the third etching stop layer 690 in contact with the upper surface of the second etching stop layer 680 may be disposed on the upper surface of the second etching stop layer 680.

For example, the first etching stop layer 160 may include aluminum nitride (AlN). In one or more embodiments, the first etching stop layer 160 may include aluminum oxide (AlO). For example, the third etching stop layer 690 may include aluminum nitride (AlN). In one or more embodiments, the third etching stop layer 690 may include aluminum oxide (AlO). The second etching stop layer 680 may include a different material from that of each of the first etching stop layer 160 and the third etching stop layer 690. For example, the second etching stop layer 680 may include one of silicon oxide ($SiO_2$), silicon nitride (SiN), silicon oxynitride (SiCN), silicon oxycarbide (SiOC), and silicon carbide (SiC).

For example, the third etching stop layer 690 may contain nitrogen (N) atoms at the fourth atomic percentage. For example, the fourth atomic percentage of nitrogen (N) atoms contained in the third etching stop layer 690 may be smaller than the first atomic percentage of nitrogen (N) atoms contained in the first portion 161 of the first etching stop layer 160. Furthermore, the fourth atomic percentage of nitrogen (N) atoms contained in the third etching stop layer 690 may be smaller than the second atomic percentage of nitrogen (N) atoms contained in the second portion 162 of the first etching stop layer 160.

Although embodiments of the present disclosure have been described with reference to the accompanying drawings, the present disclosure is not limited to the above embodiments, but may be implemented in various different forms. A person skilled in the art may appreciate that the present disclosure may be practiced in other concrete forms without changing the technical spirit or essential characteristics of the present disclosure. Therefore, it should be appreciated that the embodiments as described above is not restrictive but illustrative in all respects.

What is claimed is:

1. A semiconductor device comprising:

a substrate;

an interlayer insulating layer on the substrate;

an upper wiring trench in the interlayer insulating layer;

an upper wiring layer comprising an upper wiring barrier layer along a sidewall of the upper wiring trench and a bottom surface of the upper wiring trench, and an upper wiring filling layer on the upper wiring barrier layer, wherein the upper wiring filling layer fills an inside of the upper wiring trench; and a first etching stop layer on each of an upper surface of the interlayer insulating layer and an upper surface of the upper wiring layer, the first etching stop layer comprising:

a first portion in contact with an upper surface of the upper wiring filling layer;

a second portion in contact with an upper surface of the upper wiring barrier layer; and a third portion in contact with the upper surface of the interlayer insulating layer, wherein a percentage of nitrogen (N) in the first portion is greater than a percentage of nitrogen (N) in the second portion.

2. The semiconductor device of claim 1, wherein the percentage of nitrogen (N) in the second portion is greater than a percentage of nitrogen (N) in the third portion.

3. The semiconductor device of claim 1, wherein the first etching stop layer comprises aluminum nitride (AlN).

4. The semiconductor device of claim 1, further comprising:

a via trench under the upper wiring trench in the interlayer insulating layer; and a via connected to the upper wiring layer, the via comprising:

a via barrier layer along a sidewall of the via trench and a bottom surface of the via trench; and a via filling layer on the via barrier layer, wherein the via filling layer fills an inside of the via trench, wherein a width of the via in a horizontal direction is smaller than a width of the upper wiring layer in the horizontal direction.

5. The semiconductor device of claim 4, wherein the upper wiring barrier layer is between an upper surface of the via filling layer and a lower surface of the upper wiring filling layer.

6. The semiconductor device of claim 4, wherein an upper surface of the via filling layer is in contact with a lower surface of the upper wiring filling layer.

7. The semiconductor device of claim 1, wherein the upper wiring filling layer comprises:

a first conductive layer filling a portion of the upper wiring trench; and a second conductive layer on an upper surface of the first conductive layer, wherein the second conductive layer comprises a material different from a material of the first conductive layer, and wherein the second conductive layer is in contact with the first portion.

8. The semiconductor device of claim 7, wherein a sidewall of the second conductive layer is in contact with the upper wiring barrier layer.

9. The semiconductor device of claim 1, wherein the upper wiring filling layer is a single film.

10. The semiconductor device of claim 1, further comprising an upper interlayer insulating layer on an upper surface of the first etching stop layer, wherein the upper interlayer insulating layer is in contact with the upper surface of the first etching stop layer.

11. The semiconductor device of claim 1, further comprising:

a second etching stop layer on an upper surface of the first etching stop layer, wherein the second etching stop layer is in contact with the upper surface of the first etching stop layer; and a third etching stop layer on an upper surface of the second etching stop layer, wherein the third etching stop layer is in contact with the upper surface of the second etching stop layer, wherein the second etching stop layer comprises a material different from a material of each of the first etching stop layer and the third etching stop layer.

12. The semiconductor device of claim 11, wherein a percentage of nitrogen (N) in the third etching stop layer is smaller than the percentage of nitrogen (N) in the second portion.

13. A semiconductor device comprising:

a substrate;

an interlayer insulating layer on the substrate;

a via trench in the interlayer insulating layer;

a via comprising:

a via barrier layer along a sidewall of the via trench and a bottom surface of the via trench; and a via filling layer on the via barrier layer, wherein the via filling layer fills an inside of the via trench;

an upper wiring trench on the via trench in the interlayer insulating layer;

an upper wiring layer connected to the via, the upper wiring layer comprising:

an upper wiring barrier layer along a sidewall of the upper wiring trench and a bottom surface of the upper wiring trench; and an upper wiring filling layer on the upper wiring barrier layer, wherein the upper wiring filling layer fills an inside of the upper wiring trench; and a first etching stop layer on each of an upper surface of the interlayer insulating layer and an upper surface of the upper wiring layer, the first etching stop layer comprising:

a first portion in contact with an upper surface of the upper wiring filling layer;

a second portion in contact with an upper surface of the upper wiring barrier layer; and a third portion in contact with the upper surface of the interlayer insulating layer, wherein a width of the via in a horizontal direction is smaller than a width of the upper wiring layer in the horizontal direction, and wherein a percentage of nitrogen (N) in the first portion is greater than a percentage of nitrogen (N) in the third portion.

14. The semiconductor device of claim 13, wherein the percentage of nitrogen (N) in the first portion is greater than a percentage of nitrogen (N) in the second portion.

15. The semiconductor device of claim 13, wherein a percentage of nitrogen (N) in the second portion is greater than the percentage of nitrogen (N) in the third portion.

16. The semiconductor device of claim 13, further comprising:

a lower interlayer insulating layer between an upper surface of the substrate and a lower surface of the interlayer insulating layer; and a lower wiring layer in the lower interlayer insulating layer, wherein the lower wiring layer is connected to the via.

17. The semiconductor device of claim 13, wherein the upper wiring barrier layer is between an upper surface of the via filling layer and a lower surface of the upper wiring filling layer.

18. The semiconductor device of claim 13, wherein an upper surface of the via filling layer is in contact with a lower surface of the upper wiring filling layer.

19. The semiconductor device of claim 13, further comprising:

a second etching stop layer on an upper surface of the first etching stop layer, wherein the second etching stop layer is in contact with the upper surface of the first etching stop layer; and a third etching stop layer on an upper surface of the second etching stop layer, wherein the third etching stop layer is in contact with the upper surface of the second etching stop layer, wherein the second etching stop layer comprises a material different from a material of each of the first etching stop layer and the third etching stop layer.

20. A semiconductor device comprising:

a substrate;

a lower interlayer insulating layer on the substrate;

a lower wiring layer in the lower interlayer insulating layer;

an interlayer insulating layer on an upper surface of the lower interlayer insulating layer and an upper surface of the lower wiring layer;

a via trench in the interlayer insulating layer;

a via connected to the lower wiring layer, the via comprising:

a via barrier layer along a sidewall of the via trench and a bottom surface of the via trench; and a via filling layer on the via barrier layer, wherein the via filling layer fills an inside of the via trench;

an upper wiring trench on the via trench in the interlayer insulating layer;

an upper wiring layer connected to the via, the upper wiring layer comprising:

an upper wiring barrier layer along a sidewall of the upper wiring trench and a bottom surface of the upper wiring trench;

a first conductive layer on the upper wiring barrier layer, wherein the first conductive layer fills a portion of an inside of the upper wiring trench; and a second conductive layer on an upper surface of the first conductive layer, the second conductive layer comprising a material different from a material of the first conductive layer;

an etching stop layer on each of an upper surface of the interlayer insulating layer and an upper surface of the upper wiring layer, the etching stop layer comprising:

a first portion in contact with an upper surface of the second conductive layer;

a second portion in contact with an upper surface of the upper wiring barrier layer; and a third portion in contact with the upper surface of the interlayer insulating layer; and an upper interlayer insulating layer in contact with an upper surface of the etching stop layer on the upper surface of the etching stop layer, wherein a width of the via in a horizontal direction is smaller than a width of the upper wiring layer in the horizontal direction, wherein the upper wiring barrier layer is between an upper surface of the via filling layer and a lower surface of the first conductive layer, wherein a percentage of nitrogen (N) in the first portion is greater than a percentage of nitrogen (N) in the second portion, and wherein the percentage of nitrogen (N) in the second portion is greater than a percentage of nitrogen (N) in the third portion.

* * * * *